(12) United States Patent
Ton

(10) Patent No.: US 6,621,883 B1
(45) Date of Patent: Sep. 16, 2003

(54) METHOD AND MEANS FOR DATA DETECTION IN SCSI ULTRA-3 DISC INTERFACE

(75) Inventor: Van T. Ton, San Jose, CA (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/476,922

(22) Filed: Jan. 4, 2000

Related U.S. Application Data

(60) Provisional application No. 60/114,744, filed on Jan. 4, 1999.

(51) Int. Cl.[7] ............................................. H04L 23/00
(52) U.S. Cl. ..................... 375/377; 713/400; 327/141
(58) Field of Search ................... 375/316, 354, 375/359, 360, 377; 327/1, 24, 165, 166, 291, 141, 142, 176; 326/93; 713/400

(56) References Cited

U.S. PATENT DOCUMENTS

| | | | | |
|---|---|---|---|---|
| 5,563,532 A | | 10/1996 | Wu et al. ........................ 327/34 |
| 5,608,883 A | | 3/1997 | Kando et al. ................ 395/309 |
| 5,684,982 A | * | 11/1997 | Gates .......................... 713/400 |
| 5,729,719 A | * | 3/1998 | Gates .......................... 713/400 |
| 6,055,587 A | * | 4/2000 | Asami et al. .................. 710/49 |
| 6,163,853 A | * | 12/2000 | Findlay et al. .................. 714/4 |
| 6,167,470 A | * | 12/2000 | Ishii ............................. 710/62 |
| 6,272,648 B1 | * | 8/2001 | Findlay et al. .................. 714/4 |
| 6,286,072 B1 | * | 9/2001 | Bredin et al. ............... 710/305 |

* cited by examiner

Primary Examiner—Jean B. Corrielus
(74) Attorney, Agent, or Firm—Kirk A. Cesari

(57) ABSTRACT

A method for data detection includes signal transition detection of an input signal. When a falling edge is detected, a rising edge in a negative signal is generated. When a rising edge is detected, a rising edge in a positive signal is generated. Data is latched from the bus for the rising edge of the positive/negative edge signal. A falling edge in the positive/negative edge signal is generated after a period of time. The steps are repeated for each detected signal transition. A data detection apparatus includes a QAEDN to generate a rising edge on the negative signal for detected falling edges. A memory unit latches data from the bus for rising edges of the negative signal. A QAEDP generates a rising edge on a positive edge signal in response to detected rising edges. A memory unit latches data from the bus for rising edges of the positive signal.

20 Claims, 12 Drawing Sheets

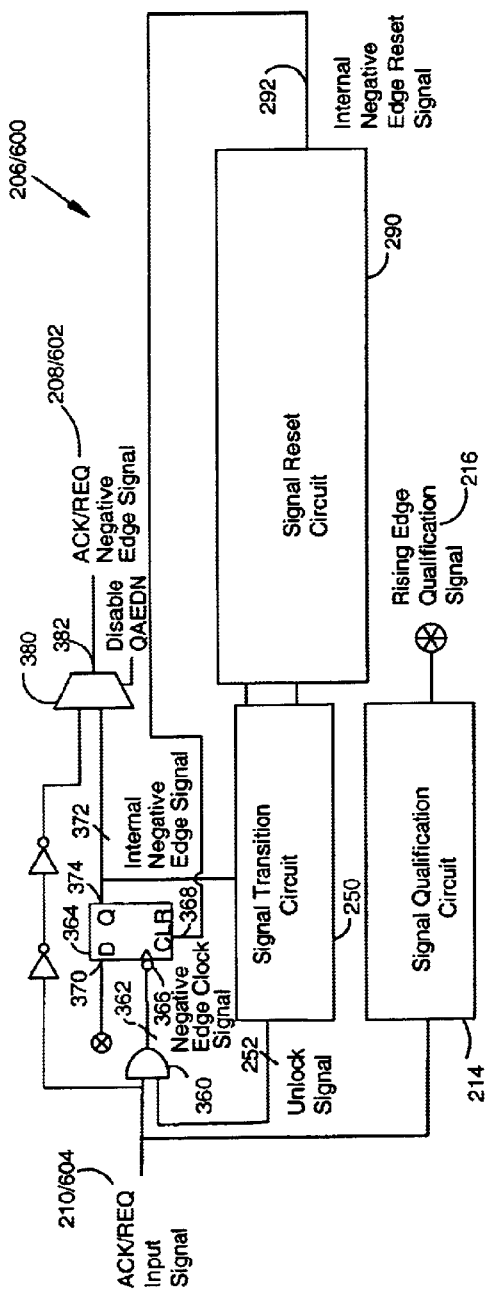
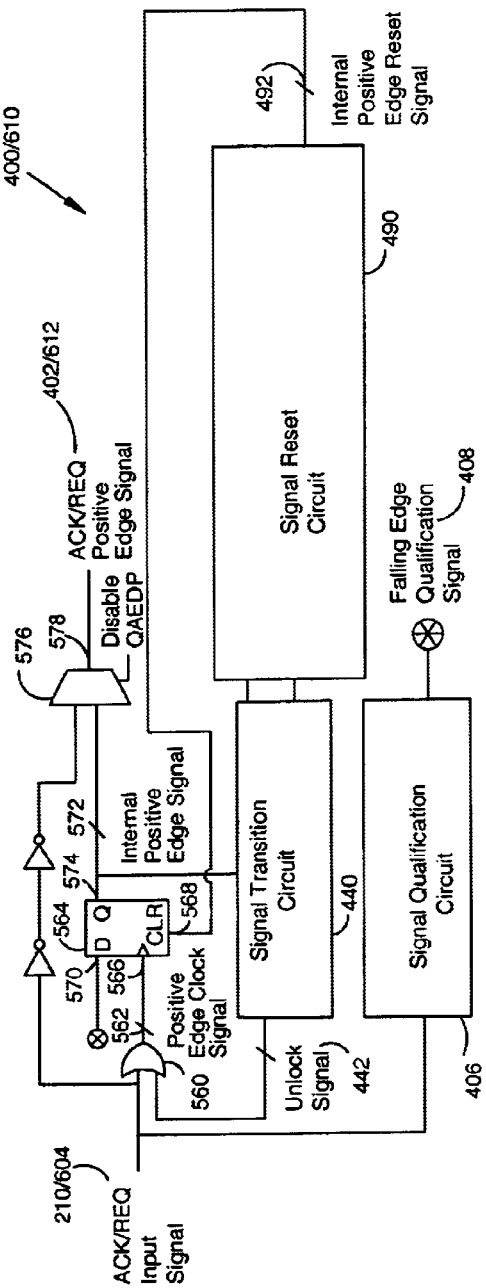
FIG. 6
FIG. 7

Timing diagram of the QAEDN in normal double transition clocking data transfer

Timing diagram of the QAEDN in double transition clocking with noises occurred during the data transfer Timing diagram of the QAEDP in normal double transition clocking data transfer The timing diagram of the QAEDP in double transition clocking with noises occured during data transfer

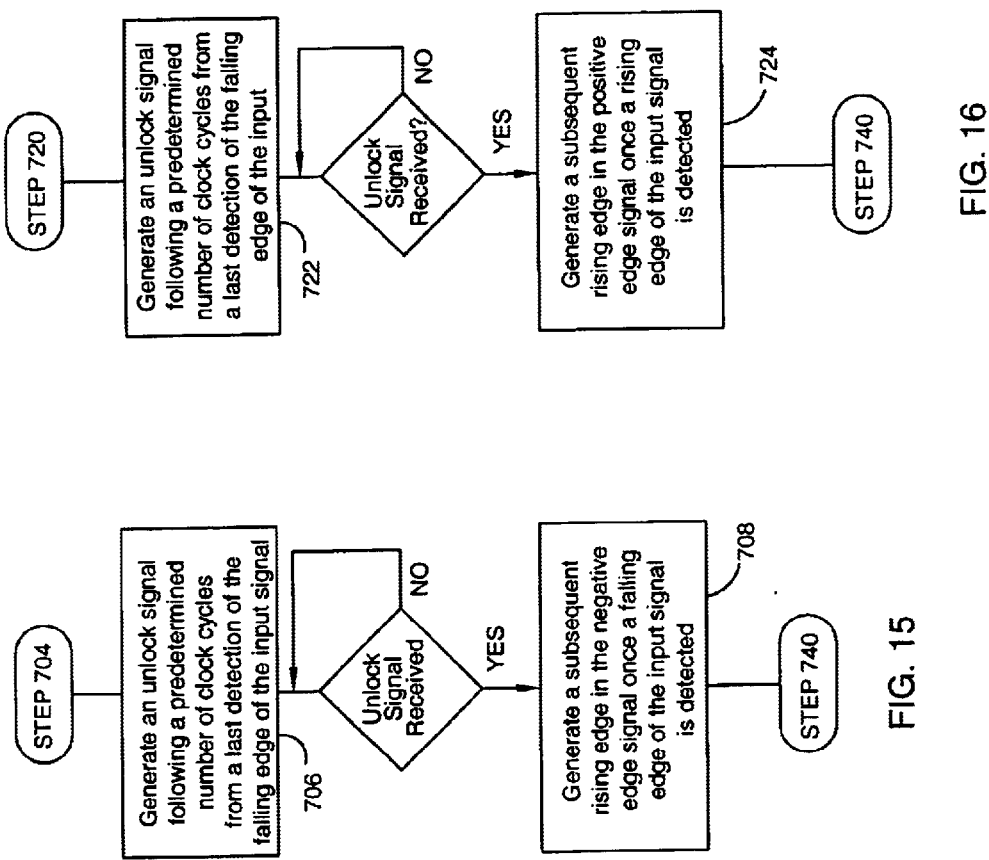
FIG. 16
FIG. 15
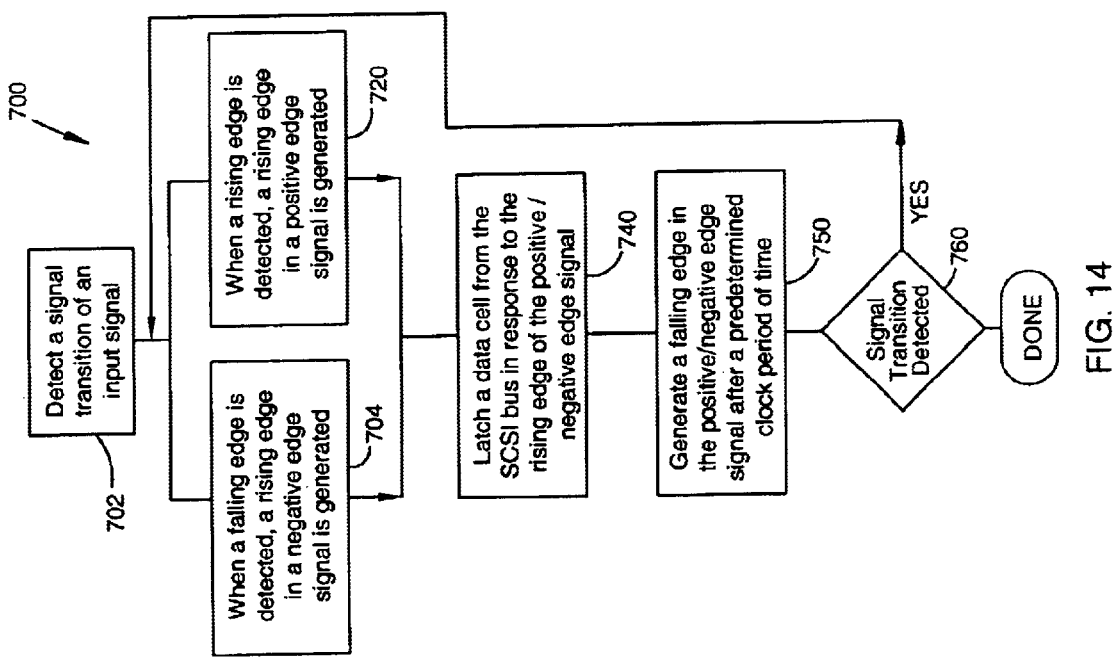
FIG. 14

METHOD AND MEANS FOR DATA DETECTION IN SCSI ULTRA-3 DISC INTERFACE

CROSS REFERENCE TO RELATED APPLICATIONS

This invention claims the benefit of U.S. Provisional Patent application Ser. No. 60/114,744; filed Jan. 4, 1999.

FIELD OF THE INVENTION

The present invention relates to a method and apparatus for data detection from a bus utilizing double transition clocking data transfers. More particularly, the present invention relates to a method and apparatus for detecting data on an SCSI bus as defined in the SCSI Ultra-3 specification.

BACKGROUND OF THE INVENTION

The Small Computer System Interface (SCSI) encompasses a set of evolving ANSI standard electronic interfaces that allow personal computers to communicate with peripheral hardware such as disk drives, tape drives, CD-ROM drives, printers, etc. The original SCSI, commonly referred to as SCSI-1, evolved into SCSI-2, commonly referred to as "plain SCSI" due to its overwhelming adoption by the computing community. SCSI-3 expands on SCSI-2 to include a set of primary commands and additional specialized command sets to meet the needs of specific device types. A widely implemented SCSI standard is Ultra-2, which uses a 40 MHz clock rate to maximize data transfer rates to 80 Mbps. However, the latest SCSI standard is Ultra-3, which increases the maximum burst rate from 80 Mbps to 160 Mbps by utilizing a full clock rate rather than the half-clock rate of Ultra-2.

Data detection on an SCSI bus poses a special set of problems. In prior art systems, data detection on a SCSI bus is accomplished by sampling the bus at a particular clock rate to determine a change in one or more signals on the SCSI bus. If a change is detected, the sample containing the change is stored in a trace buffer along with a time stamp. FIG. 1 depicts this prior technique for detecting data on the SCSI bus 100. An SCSI data phase cycle 102 along with a first sample 104 and a second sample 106, defining an analyzer sampling period 108, are depicted with reference to FIG. 1. At the time when the first sampling 104 is taken, the handshaking line 110 is inactive. However, by at the time the second sampling 106 is taken, the handshaking line 110 is active. Data is correctly detected on the SCSI bus because the status of the handshake line 110 differs during the analyzer sampling period 108 and the second sample also contains valid SCSI bus data associated with the transition of the handshake line 110.

As depicted in FIG. 2, implementation of Ultra SCSI, specifically the transfer rate required, necessitates shortened setup and hold times relative to the handshake line 110 edge. Applying the prior art data detection technique described above, the second sample would be saved in the trace buffer because the status of the handshake line 110 differs during the analyzer sampling period 108. Yet, in this case, the data that is saved as part of the second sample is not valid because the data hold time 112 has expired. For example, the data transfer rate in SCSI Ultra-2 at the protocol chip requires a minimum setup and hold time of 4.5 ns and 4.5 ns, respectively, and the requirements are longer for slower data transfer rates. However, in the SCSI Ultra-3, double transition clocking is used requiring data setup and hold times of 1.25 ns, resulting in a much smaller window for sampling data from the bus. The real window for capturing data in the protocol chip is actually smaller, because there are factors which affect and reduce the sampling window. Some of these factors include driver skew, approximately about 100 ps, and the signal rising and the signal falling edge differences, approximately about 200 ps. Therefore, the actual setup and hold time at the protocol chip is less than 1 ns.

Furthermore, in an SCSI system, there may be noise, which is induced by any electrical interference, crosstalk, reflections, or other sources. This interference influences the control signals on the SCSI bus, such as REQ or ACK signals. The receiver must have the means to select and detect the correct data in the right window at the right time. Prior art techniques for selection and detection of data include signal filter designs such as traditional glitch filters 120. Unfortunately, the prior art filter design have several disadvantages as depicted in FIG. 3. First, the active edge 122 of the control signal 124 is delayed by a programmable period of time t 126. Also, the signal filters 120 do not take the first edge 128 of the ACK/REQ input signal 124. The pulse width of noises to be filtered are also limited within the range of $\leq t$ 126. In addition, invalid data is potentially captured if a noise pulse width is larger than t 126. The prior art filter designs are also process dependent.

Recent glitch filter designs 120, for example as described in U.S. Pat. No. 5,563,532 ('532 patent), filter noise from both the falling edge 122 or rising edge 130 of the ACK/REQ input signals. The filter technique described in the '532 patent allows data detection from a bus utilizing dual edge data transfers or double transition clocking. However, as depicted in FIG. 3, the filter delays the falling 122 or rising edge 130 in an output filter signal 132 based on the duration of the shoulder or ringing noise 126 on the transition line of the ACK/REQ input signal 124. If the delay 126 in the rising or falling edge of the output filter signal 132 is greater than the 1.25 ns setup and hold time required for SCSI Ultra-3, incorrect data is latched from the SCSI bus. The data cell 134 on the falling edge 122 and data cell 136 on the rising edge 130 will not be latched correctly.

What is needed is a data detection technique that filters noise from the transmission line without adding signal delay to a filtered output signal. A need also exists for technique that only takes the first edge of the asynchronous input signal for its filtered output signal. Data is then latched from the bus at the first edge of an ACK/REQ input signal, thereby eliminating all transmission noise that causes a shoulder or ringing noise on the transmission line. A need also exists for a technique that eliminates all noise inside a protection time window after the first edge the ACK/REQ input signal. A need for a protection time window that is programmable for faster or slower input frequencies also exists. The data detection circuitry must also be process independent, since no delay lines or cells are used.

SUMMARY OF THE INVENTION

The present invention overcomes the identified problems by providing a method and apparatus for data detection from a bus utilizing double transition clocking data transfers. More particularly, the present invention relates to a method and apparatus for detecting data on an SCSI bus as defined in the SCSI Ultra-3 specification. SCSI Ultra-3 protocol utilizes double-transition clocking. In double transition clocking, both the rising edge and falling edge of REQ (or ACK) signals are used to detect data. The invention, therefore, has two different circuits, one for the rising and one for the falling edge. A qualified asynchronous edge detector negative (QAEDN) detects a falling edge of an input ACK/REQ signal, and a qualified asynchronous edge detector positive (QAEDP) detects a rising edge of the input ACK/REQ signal.

In accordance with one embodiment of the invention, a method for data detection on the SCSI bus is disclosed in which a signal transition of an input signal is detected. When a falling edge of the input signal is detected, a rising edge in a negative edge signal is generated. When a rising edge of the input signal is detected, a rising edge in a positive edge signal is generated. A data cell is then latched from the SCSI bus in response to the rising edge of the positive/negative edge signal. A falling edge in the positive/negative edge signal is generated a after a predetermined clock period of time. The aforementioned steps are repeated for each detected signal transition of the input signal.

In accordance with another embodiment of the invention, an apparatus and system implementing the inventive methods is disclosed. A data detection apparatus includes a first qualified asynchronous edge detector negative configured to generate a rising edge signal transition of an ACK negative edge signal in response to each valid falling edge detected from an ACK input signal. A first asserted edge memory unit is configured to latch a data cell from the SCSI bus in response to each valid rising edge of the ACK negative edge signal. A first qualified asynchronous edge detector positive is configured to generate a rising edge signal transition of an ACK positive edge signal in response to each valid rising edge detected from the ACK input signal. A first de-asserted edge memory unit is configured to latch a data cell from the SCSI bus in response to each rising edge of the ACK positive edge signal. A second qualified asynchronous edge detector negative is configured to generate a rising edge signal transition of an REQ negative edge signal in response to each valid falling edge detected from a REQ input signal. A second asserted edge memory unit is configured to latch a data cell from the SCSI bus in response to each rising edge of the REQ negative edge signal. A second qualified asynchronous edge detector positive is configured to generate a rising edge signal transition of an positive edge signal in response to each valid rising edge detected from the REQ input signal. A second de-asserted edge memory unit is configured to latch a data cell from the SCSI bus in response to each rising edge of the REQ positive edge signal. A filter block is configured to delay the generation of a strobe signal to transfer data cells from the first and second asserted edge and the first and second de-asserted edge memory units to an intermediate storage device. Finally, a synchronization block is configured to transfer data from the intermediate storage to a host.

Advantages of the invention include a data detection apparatus and method that does not add signal delay from an input ACK/REQ signal to a filtered output signal. In addition, only the first edge of the asynchronous ACK/REQ input signal is taken for the filtered output signal. Data is therefor latched from the bus at the first edge of an ACK/REQ input signal, thereby eliminating all transmission noise that causes a shoulder or ringing noise on the transmission line. The present invention also eliminates all noise inside a protection time window after the first edge. The protection time window of the present invention can be programmable for a faster or slower input frequency. Also, the circuitry is process independent, since no delay lines or cells are used. The present invention also utilizes a high frequency clock such that it provides small granularity for extending the protection window from the valid edge to its maximum before the next valid edge. For example, the period of time between two valid falling edges, or two valid rising edges of ACK/REQ input signal in the double transition clocking mode in SCSI-3 is 25 ns. In QAEDN and QAEDP designs a 160 Mhz clock is used, and therefore, the protection window can be extended to a maximum of 21.8 ns.

BRIEF DESCRIPTION OF THE DRAWINGS

Additional advantages and features of the invention will become readily apparent upon reading the following detailed description and appended claims when taken in conjunction with reference to the following drawings, in which:

FIG. 6 depicts a qualified asynchronous edge detector negative circuit for the data detection architecture according to a first embodiment of the invention;

FIG. 7 depicts a qualified asynchronous edge detector positive circuit for the data detection architecture according to a first embodiment of the invention;

FIG. 14 is a flowchart depicting method steps for detecting a valid signal transition in a SCSI Ultra-3 dual-transition transfer in order to latch data from an SCSI bus according to a first embodiment of the invention;

FIG. 15 is a flowchart depicting additional method steps for detecting a valid signal transition in a SCSI Ultra-3 dual-transition transfer in order to latch data from an SCSI bus according to a further embodiment of the invention;

FIG. 16 is a flowchart depicting additional method steps for detecting a valid signal transition in a SCSI Ultra-3 dual-transition transfer in order to latch data from an SCSI bus according to a further embodiment of the invention;

DETAILED DESCRIPTION

Figure 1:
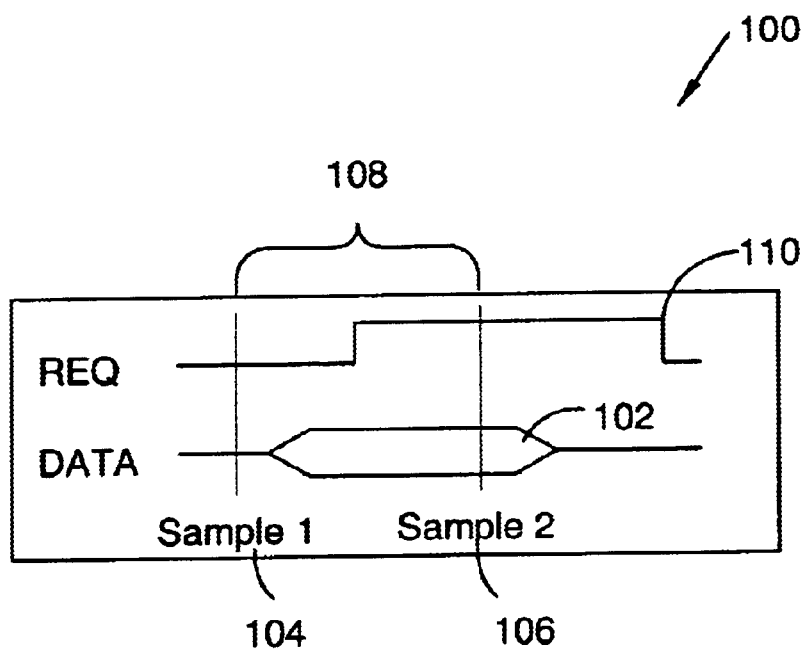
FIG. 1 depicts a prior art technique for detecting data on a SCSI bus.
Figure 2:
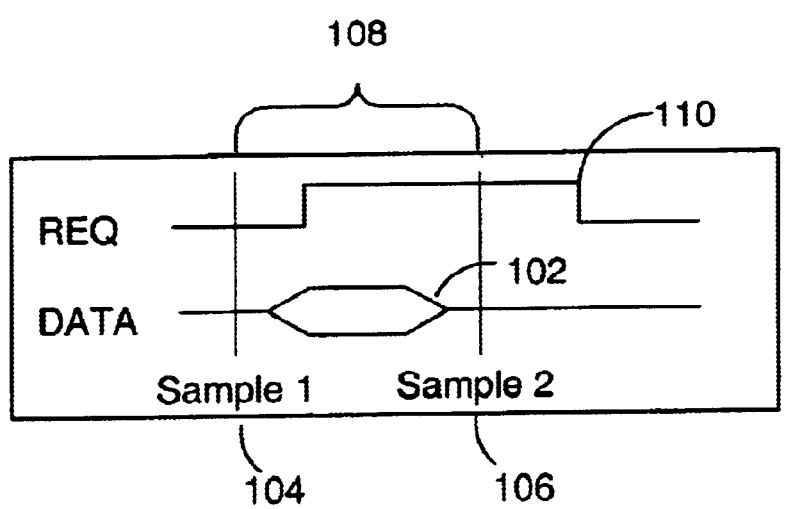
FIG. 2 depicts a further prior art technique for detecting data on a SCSI bus.
Figure 3:
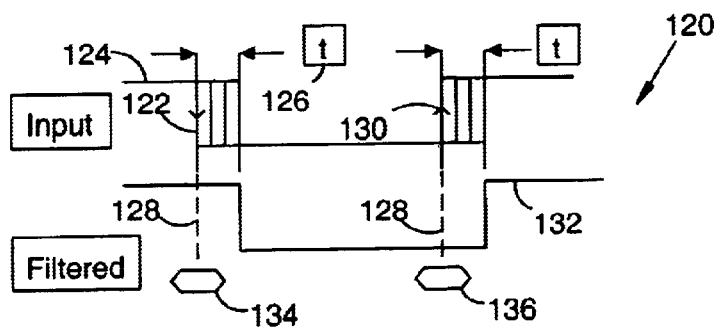
FIG. 3 depicts a further prior art technique for filtering noise from an input signal.

The present invention overcomes the identified prior art problems by providing a method and apparatus for data detection from a bus utilizing double transition clocking data transfers. More particularly, the present invention relates to a method and apparatus for detecting data on an SCSI bus as defined in the SCSI Ultra-3 specification. During data transfers on the SCSI bus, it is possible that noise will be on control signals which is caused by other SCSI devices in the system, or by any electrical effects in the system environment. The invention provides protection for the data received at the receiver by using the first valid edge of the asynchronous ACK/REQ input signal to sample data for each data transfer event, and ignoring all other unexpected edges after the valid edge. It also does the qualification on the incoming asynchronous ACK/REQ input signal before allowing for detection of the next valid edge of the ACK/REQ input signal for the next data transfer event. The method overcomes the limitations of prior art which are unusable at high data rates. The circuit may also be used in any application which requires signal detection in noisy environment.

Although the present invention is described with reference to the SCSI Ultra-3 Disc Interface, it will be appreciated by one of ordinary skill in the art that such details are disclosed simply to provide a more thorough understanding of the present invention and the present invention may be practiced without these specific details. In addition, the terms ACK/REQ positive edge signal and ACK/REQ negative edge signal are used to indicate the detection of a rising edge or falling each of an ACK/REQ input signal. Namely, a rising edge signal transition of the ACK/REQ positive edge signal indicates that a valid rising edge of the ACK/REQ input signal is detected; conversely, a rising edge signal transition of the ACK/REQ negative edge signal indicates that a valid falling edge of the ACK/REQ input signal is detected. Although a valid falling or rising signal transition of the ACK/REQ input signal is indicated by a rising edge of the ACK/REQ negative edge signal and ACK/REQ positive edge signal, respectively, it will be appreciated by one of ordinary skill in the art that any combination of signal transitions of the ACK/REQ negative edge signal and ACK/REQ positive edge signal could be used to indicate a valid signal transition of the ACK/REQ input signal.

A circuit to implement the method and its timing diagrams is also disclosed. Enhancements to the method are also disclosed. For example, the timing window for protecting the current data can be programmable, and the qualification time on the incoming ACK/REQ input signal can also be programmable to satisfy the longer cycle time of asynchronous ACK/REQ input signal due to slower data transfer rates.

System Architecture

A first embodiment is described with reference to FIG. 4. A data detection apparatus 200 for detecting data cells on an SCSI bus using double transition clocking is depicted. The apparatus 200 includes a first qualified asynchronous edge detector negative 206. The first qualified asynchronous edge detector negative 206 generates a rising edge signal transition of an ACK negative edge signal 208 in response to each valid falling edge detected from an ACK input signal 210. A first asserted edge memory unit 212 then latches a data cell 202 from the SCSI bus 204 in response to each rising edge of the ACK negative edge signal 208. A first qualified asynchronous edge detector positive 400 generates a rising edge signal transition of an ACK positive edge signal 402 in response to each valid rising edge detected from the ACK input signal 210. A first de-asserted edge memory unit 404 then latches a data cell 202 from the SCSI bus 204 in response to each rising edge of the ACK positive edge signal 402.

A second qualified asynchronous edge detector negative 600 generates a rising edge signal transition of an REQ negative edge signal 602 in response to each valid falling edge detected from a REQ input signal 604. A second asserted edge memory unit 606 then latches a data cell 202 from the SCSI bus 204 in response to each rising edge of the REQ negative edge signal 602. A second qualified asynchronous edge detector positive 610 generates a rising edge signal transition of an REQ positive edge signal 612 in response to each valid rising edge detected from the REQ input signal 604. A second de-asserted edge memory unit 614 then latches a data cell 202 from the SCSI bus 204 in response to each rising edge of the REQ positive edge signal 612. A filter block 620 delays the generation of a strobe signal 622 to transfer data 624 from the first and second asserted edge 212/606 and the first and second de-asserted edge 404/614 memory units to an odd even block intermediate storage device 626. Finally, a synchronization block 630 transfers the data 624 from the intermediate storage device 626 to a host (not shown).

Figure 5:
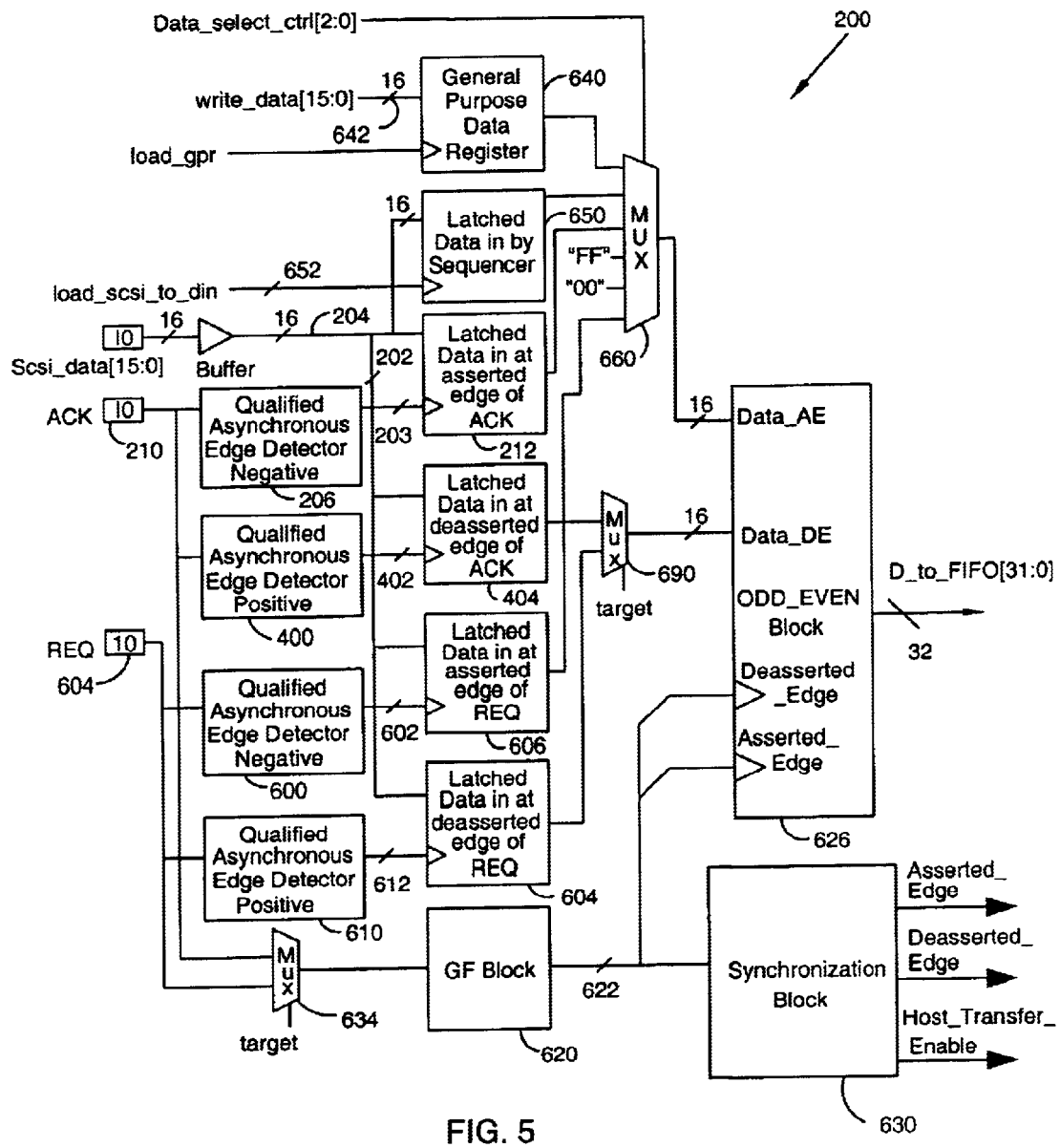
FIG. 5 depicts the data detection architecture according to a further embodiment of the invention.

An exemplary embodiment of the data detection apparatus 200 is described with reference to FIG. 5. The data detection apparatus 200 further includes an input control gate 634 coupled to the filter block 620. The input control gate 634 has a first state wherein the ACK input signal 210 is transferred to the filter block 620 and a second state wherein the REQ input signal 604 is transferred to the filter block 620. A general purpose data register 640 stores host write data 642. While a data memory unit 650 latches control data 650 from a sequencer bus 652. An asserted data control gate 660 is coupled to the intermediate storage device 626. The asserted data control gate 660 has a first state wherein the host write data 642 is transferred to the intermediate storage device 626; a second state wherein the control data is transferred to the intermediate storage device 626; a third state wherein the data cell 202 within the first asserted edge memory unit 212 is transferred to the intermediate storage device 626; and a forth state wherein the data cell 202 within the second asserted edge memory unit 606 is transferred to the intermediate storage device 626. A de-asserted data control gate 670 is coupled to the intermediate storage device 626. The de-asserted data control gate 670 has a first state wherein the data cell 202 within the first de-asserted edge memory unit 404 is transferred to the intermediate storage device 626 and a second state wherein the data cell 202 within the second de-asserted edge memory unit 614 is transferred to the intermediate storage device 626.

In accordance with another embodiment of the invention 200 depicted in FIG. 6, the first and second qualified asynchronous edge detector negative 206/600 include a signal qualification circuit 214 that generates a rising edge qualification signal 216. Detection of a valid rising edge of the ACK/REQ input signal 210/604 is verified by ensuring that the rising edge of the ACK/REQ input signal 210/604 does not fluctuate for a predetermined number of clock cycles. In doing so, noise from the ACK/REQ negative edge signal 208/602 is eliminated. A signal transition circuit 250 generates an unlock signal 252 following a predetermined number of clock cycles from a last detection of the falling edge of the ACK/REQ input signal 210/604. A signal reset circuit 290 generates a internal negative edge reset signal 292 for the ACK/REQ negative edge signal 208/602 after a predetermined clock period of time. An AND gate 360 then generates a negative edge clock signal 362 from a logical AND operation of the ACK/REQ input signal 210/604 and the unlock signal 252.

A latch circuit 364 generates the ACK/REQ negative edge signal 208/602. The latch circuit 364 has a complement value of the negative edge clock signal 362 as a clock signal 366, the internal negative edge reset signal 292 as a reset signal 368 and the rising edge qualification signal 216 as a data input signal 370. The latch circuit 364 then generates an internal negative edge signal 372 as a data output 374. An output control gate 380 has a first state wherein the ACK/REQ input signal 210/604 is transferred as an output 382 of the output control gate 380 and a second state wherein internal negative edge signal 372 is transferred as the output 382 of the output control gate 380 to generate the ACK/REQ negative edge signal 208/602.

In accordance with a further embodiment of the invention 200 depicted in FIG. 7, the first and second qualified asynchronous edge detector positive 400/610 include a signal qualification circuit 406 that generates a falling edge qualification signal 408. Detection of a valid falling edge of the ACK/REQ input signal 210/604 is verified by ensuring that the falling edge of the ACK/REQ input signal 210/604 does not fluctuate for a predetermined. number of clock cycles. In doing so, noise from the ACK/REQ positive edge signal 402/612 is eliminated. A signal transition circuit 440 generates an unlock signal 442 following a predetermined number of clock cycles from a last detection of the rising edge of the ACK/REQ input signal 210/604. A signal reset circuit 490 generates a positive edge reset signal 492 for the ACK/REQ positive edge signal 402/612 after a predetermined clock period of time. An OR gate 560 then generates a positive edge clock signal 562 from a logical OR operation of the ACK/REQ input signal 210/604 and the unlock signal 442.

A latch circuit 564 generates the ACK/REQ positive edge signal 402/612. The latch circuit 564 has the positive edge clock signal 562 as a clock signal 566, the internal positive edge reset signal 492 as a reset signal 568 and the falling edge qualification signal 408 as a data input 570. The latch circuit 564 then generates an internal positive edge signal 572 as a data output 574. An output control gate 576 has a first state wherein the ACK/REQ input signal 210/604 is transferred as an output 578 of the output control gate 576 and a second state wherein internal positive edge signal 572 is transferred as the output 578 of the output control gate 576. The output control gate 576 completes the generation of the ACK/REQ positive edge signal 402/612.

Figure 8:
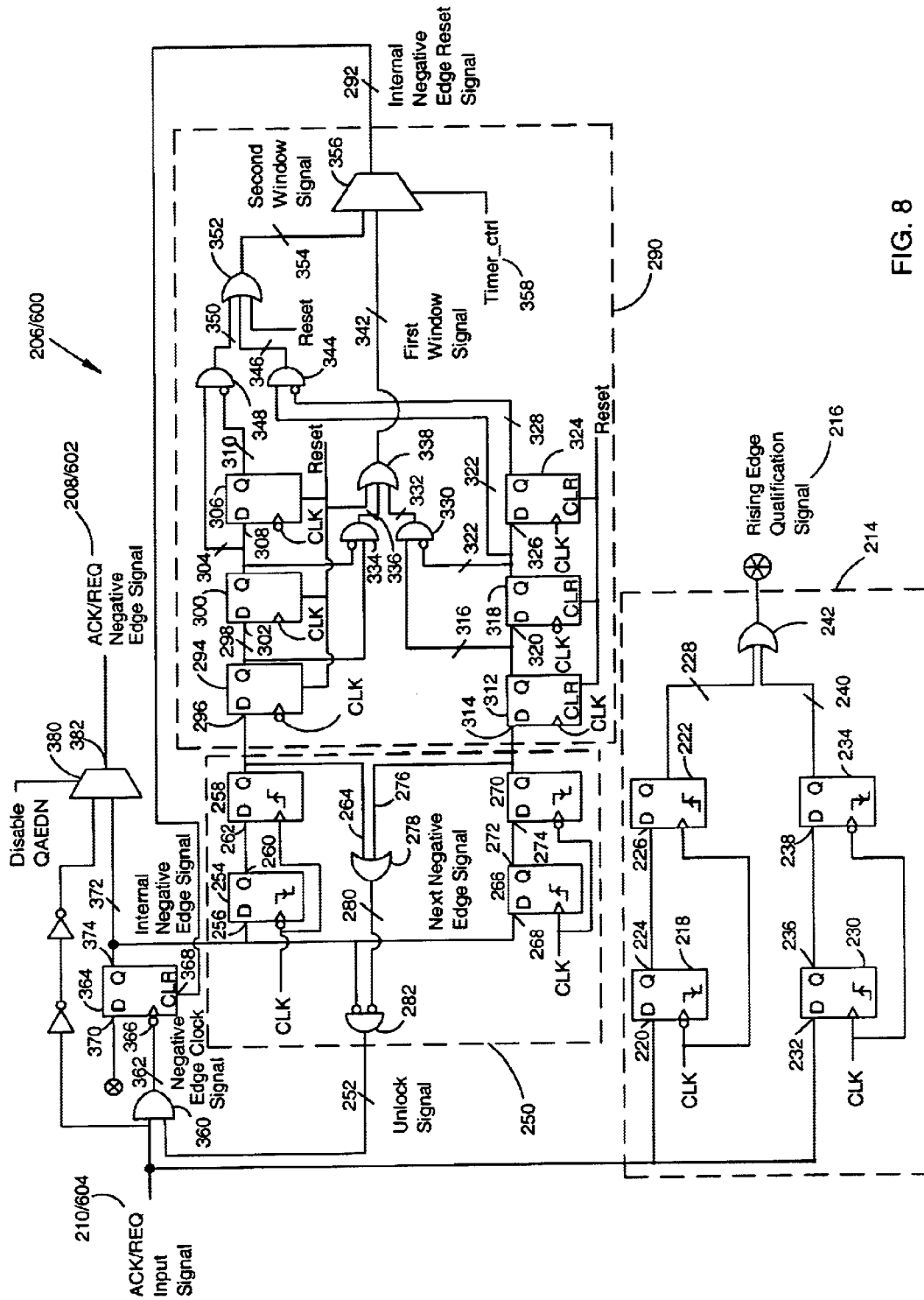
FIG. 8 depicts the qualified asynchronous edge detector negative circuit according to an exemplary embodiment of the invention.

A further embodiment of the first and second qualified asynchronous edge detector negative 206/600 is described with reference to FIG. 8, wherein the signal qualification circuit 214 includes a first negative edge trigger flip-flop 218 having the ACK/REQ input signal 210/604 as a data input 220. A first positive edge trigger flip-flop 222 has an output 224 of the first negative edge trigger flip-flop 218 as a data input 226 and generates a first data output 228. A second positive edge trigger flip-flop 230 also has the ACK/REQ input signal 210/604 as a data input 232. A second negative edge trigger flip-flop 234 has an output 236 of the second positive edge trigger flip-flop 230 as a data input 238 and generates a second data output 240. An OR gate 242 performs a logical OR operation from the first data output 228 and the second data 240 output to generate the rising edge qualification signal 216.

A further embodiment of the first and second qualified asynchronous edge detector negative 206/600 is also described with reference to FIG. 8, wherein the signal transition circuit 250 includes a first negative edge trigger flip-flop 254 has the internal negative edge signal 372 as a data input 256. A first positive edge trigger flip-flop 258 has an output 260 of the first negative edge trigger flip-flop 254 as a data input 262 and generates a first data output 264. A second positive edge trigger flip-flop 266 also has the internal negative edge signal 372 as a data input 268. A second negative edge trigger flip-flop 270 has an output 272 of the second positive edge trigger flip-flop 266 as a data input 274 and generate a second data output 276. An OR gate 278 performs a logical OR operation from the first data output 264 and the second data output 276 to generate a next negative edge signal 280. Generation of the unlock signal 252 is completed by an AND gate 282. The AND gate 282 performs a logical AND operation from a complement value of the internal negative edge signal 372 and a complement value of the next negative edge signal 280 to generate the unlock signal 252.

A further embodiment of the first and second qualified asynchronous edge detector negative 206/600 is also described with reference to FIG. 8, wherein the signal reset circuit 290 includes a first negative data flip-flop 294. The first negative data flip-flop.294 has the first data output 264 of the first positive edge trigger flip-flop 258 as a data input 296 and generates a first negative data output 298. A second negative data flip-flop 300 has the first negative data output 298 as a data input 302 and generates a second negative data output 304. A third negative data flip-flop 306 has the second negative data output 304 as a data input 308 and generates a third negative data output 310. A first positive data flip-flop 312 has the second data output 276 of the second negative edge trigger flip-flop 270 as a data input 314 and generates a first positive data output 316. A second positive data flip-flop 318 has the first positive data output 316 as a data input 320 and generates a second positive data output 322. A third positive data flip-flop 324 has the second positive data output 322 as a data input 326 and generates a third positive data output 328. Although there positive and there negative flip-flops are described, those skilled in the art will understand that such details are disclosed simply to provide a more thorough understanding of the present invention and the present invention may be practiced without these specific details. Additional or fewer flips may be added in order to lengthen or increase the desire duration of the positive/negative edge signal 208/602.

Using the timing delays created by the flip-flops described above, a first AND gate 330 performs a logical AND operation from the first positive data output 316 and a complement value of the second positive data output 322 to generate a first gate output 332. A second AND gate 334 performs a logical AND operation from the first negative data output 298 and a complement value of the second negative data output 304 to generate a second gate output 336. A first OR gate 338 the performs a logical OR operation from a flip-flop reset signal 340, the first gate output 332 and the second gate output 336 to generate a first window signal 342. A third AND gate 344 performs a logical AND operation from the second positive data output 322 and a complement value of the third positive data output 328 to generate a third gate output 346. A fourth AND gate 348 performs a logical AND operation from the second negative data output 304 and a complement value of the third negative data output 310 to generate a forth gate output 350. A second OR gate 352 then performs a logical OR operation from the reset signal 340, the third gate output 346 and the forth gate output 350 to generate a second window signal 354. Finally, a control gate 356 generates the negative edge reset signal 292. The control gate 356 has a first state wherein the first window signal 342 is transferred as a control gate output 358 and a second state wherein the second window signal 354 is transferred as the control gate output 358 to generate the internal negative edge reset signal 292. The states of the control gate 356 are set depending on the desired duration of the rising edge of the ACK negative edge signal 208/604 using the timer_ctrl signal 358. The control gate 356 is, for example, a 2×1 multiplexer.

Figure 9:
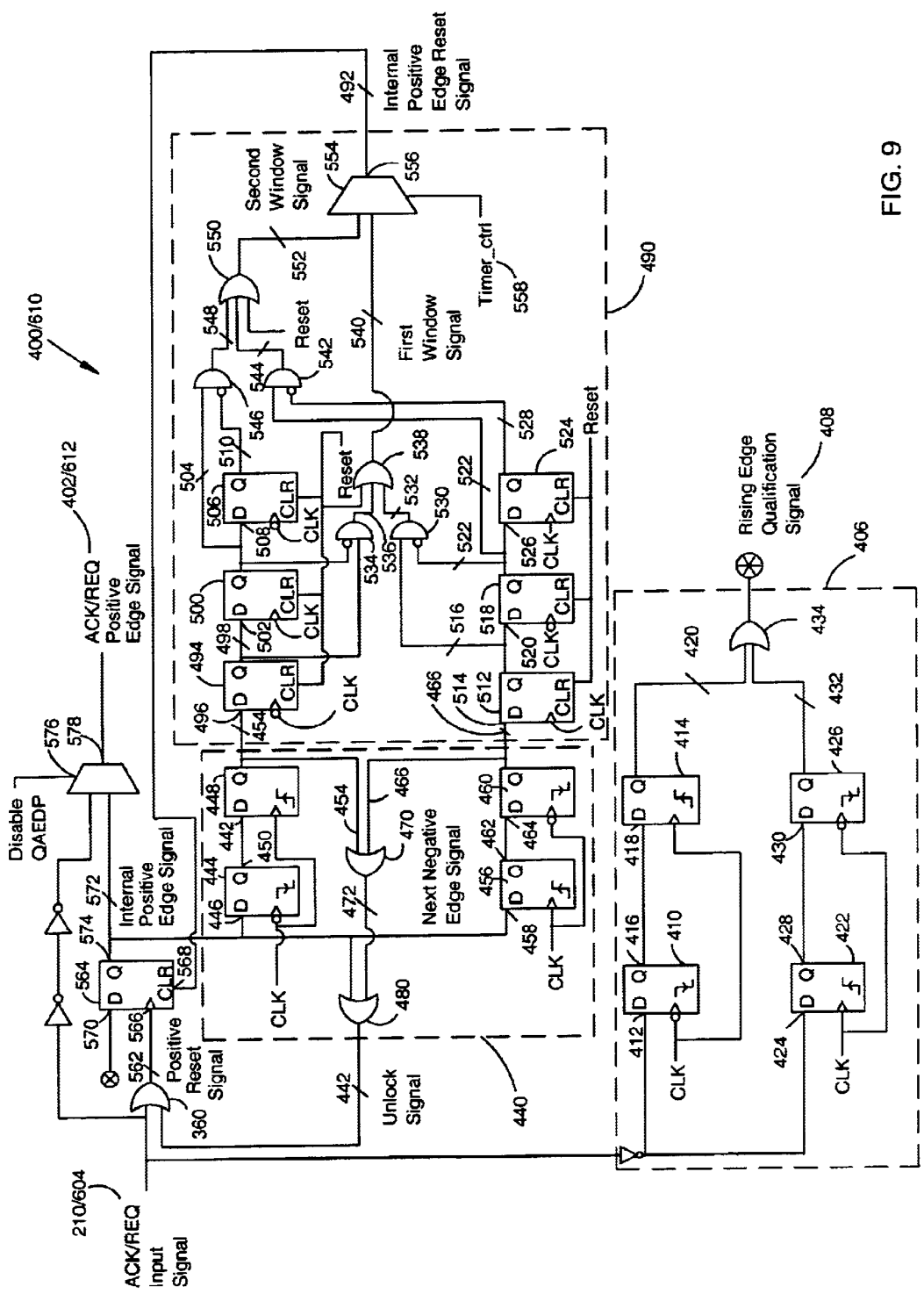
FIG. 9 depicts the qualified asynchronous edge detector positive circuit according to an exemplary embodiment of the invention.

An additional embodiment of the first and second qualified asynchronous edge detector positive 400/610 is described with reference to FIG. 9, wherein the signal qualification circuit 406 includes a first negative edge trigger flip-flop 410. The first negative edge trigger flip-flop 410 has a complement value of the ACK/REQ input signal 210/604 as a data input 412. A first positive edge trigger flip-flop 414 has an output 416 of the first negative edge trigger flip-flop 410 as a data input 418 and generates a first data output 420. A second positive edge trigger flip-flop 422 has a complement value of the ACK/REQ input signal 210/604 as a data input 424. A second negative edge trigger flip-flop 426 has an output 428 of the second positive edge trigger flip-flop 422 as a data input 430 and generates a second data output 432. An OR gate 434 then generates a logical OR operation from the first data output 420 and the second data output 432 to generate the falling edge qualification signal 408.

A further embodiment of the first and second qualified asynchronous edge detector positive 400/610 is also described with reference to FIG. 9, wherein the signal transition circuit 440 includes a first negative edge trigger flip-flop 444. The first negative edge trigger flip-flop 444 has the internal positive edge signal 572 as a data input 446. A first positive edge trigger flip-flop 448 has an output 450 of the first negative edge trigger flip-flop 444 as a data input 452 and generates a first data output 454. A second positive edge trigger flip-flop 456 has the internal positive edge signal 572 as a data input 458. A second negative edge trigger flip-flop 460 has an output 462 of the second positive edge trigger flip-flop 456 as a data input 464 and generates a second data output 466. A next edge OR gate 470 then generates a logical OR operation from the first data output 454 and the second data output 466 to generate a next positive edge signal 472. An unlock OR gate 480 completed the generation the unlock signal 442. The unlock OR gate 480 performs a logical OR operation from the internal positive edge signal 572 and the next positive edge signal 472 to generate the unlock signal 442.

A further embodiment of the first and second qualified asynchronous edge detector positive 400/610 is also described with reference to FIG. 9, wherein the signal reset circuit 490 includes a first negative data flip-flop 494. The first negative data flip-flop 494 has the first data output 454 of the first positive edge trigger flip-flop 448 as a data input 496 and generates a first negative data output 498. A second negative data flip-flop 500 has the first negative data output 498 as a data input 502 and generates a second negative data output 504. A third negative data flip-flop 506 has the second negative data output 504 as a data input 508 and generates a third negative data output 510. A first positive data flip-flop 512 also has the second data output 466 of the second positive edge trigger flip-flop 460 as a data input 514 and generates a first positive data output 516. A second positive data flip-flop 518 has the first positive data output 516 as a data input 520 and generates a second positive data output 522. A third positive data flip-flop 524 has the second positive data output 522 as a data input 526 and generates a third positive data output 528.

Using the timing delays created by the flip-flops described above, a first AND gate 530 performs a logical AND operation from the first positive data output 516 and a complement value of the second positive data output 522 to generate a first gate output 532. A second AND gate 534 performs a logical AND operation from the first negative data output 498 and a complement value of the second negative data output 504 to generate a second gate output 536. A first OR gate 538 performs a logical OR operation from a flip-flop reset signal 539, the first gate output 532 and the second gate output 536 to generate a first window signal 540. A third AND gate 542 performs a logical AND operation from the second positive data output 522 and a complement value of the third positive data output 528 to generate a third gate output 544. A fourth AND gate 546 performs a logical AND operation from the second negative data output 504 and a complement value of the third negative data output 510 to generate a forth gate output 548. A second OR gate 550 then performs a logical OR operation from the reset signal 539, the third gate output 544 and the forth gate output 548 to generate a second window signal 552. Finally, a control gate 554 generates the positive edge reset signal 492. The control gate 554 has a first state wherein the first window signal 540 is transferred as a control gate output 556 and a second state wherein the second window signal 552 is transferred as the control gate output 556 to generate the internal positive edge reset signal 492. The states of the control gate 554 are set depending on the desired duration of the rising edge of the ACK/REQ positive edge signal 402/612 using the timer_ctrl signal 558. The control gate 554 is, for example, a 2×1 multiplexer.

Figure 10:
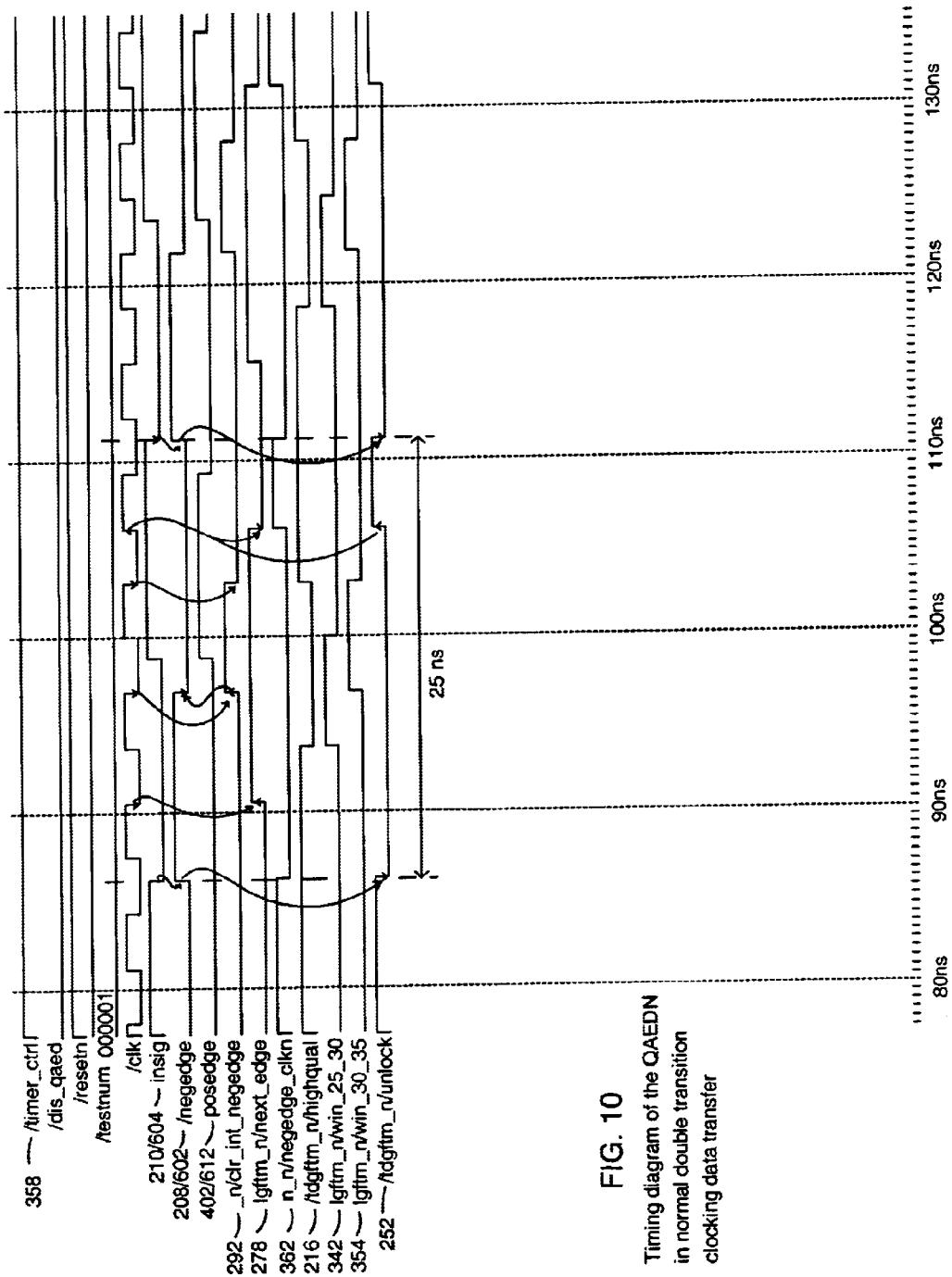
FIG. 10 is the timing diagram of the qualified asynchronous edge detector negative circuit in normal double transition clocking data transfer.

FIGS. 10 through 13 depict timing diagrams illustrating the functionality of the qualified asynchronous edge detection negative and positive 206/400. As depicted in FIG. 10, the ACK/REQ input signal 210/604 is filtered to generate the ACK/REQ negative edge 208/602 and the ACK/REQ positive edge 402/612. As shown, a rising edge of the ACK/REQ negative edge signal 208/602 is generated each time a falling edge of the ACK/REQ input signal 210/604 is detected. As depicted in FIG. 8, this functionality is accomplished by the data latch 364. Although the rising edge qualification signal 216 is initially high, the data output 374 of the data latch 364 does not reflect this value in the internal negative edge signal 372 until a complement value of the negative edge clock signal 362 is high. Since the unlock signal 252 is initially high, the negative edge clock signal 362 will go high when the ACK/REQ input signal 210/604 goes high, as indicated in FIG. 10. However, whenever the internal negative edge signal 372 is high, the unlock signal 252 is low. Therefore, the internal negative edge signal 372 will stay high until it is reset. This is accomplished by the negative edge reset signal 292.

The negative edge reset signal 292 takes the value of either the first window signal 342 or the second window signal 354. FIG. 10 shows that the second window signal 354 is used as the negative edge reset signal 292 in order to create a longer duration in the rising edge of the ACK/REQ negative edge signal 208/602. A falling edge in the ACK/REQ negative edge signal 208/602 is generated at the rising edge of the second window signal 354. Referring again to FIG. 10, if the ACK/REQ input signal has a period of 25ns, the unlock signal 252 allows the creation of a protection window to eliminate noise from the ACK/REQ negative edge signal 208/602. The protection window eliminates noise between two valid edges of the ACK/REQ input signal 210/604 for up to 21.8 ns, thereby creating a 25 ns period for the ACK/REQ negative edge signal 208/602.

The unlock signal 252 remains low, thereby preventing the generation of a subsequent rising edge in the ACK/REQ negative edge signal 208/602 until the internal negative edge signal 372 and the next negative edge signal 278 are low. The internal negative edge signal 372 will go low once the negative edge reset signal goes high. The next edge signal 278, however, will go high following at least a ½ clock cycle delay but less than a clock cycle from the rising edge of the internal negative edge signal 372 and will stay high until approximately a 1½ clock cycle delay from the falling edge of the internal negative edge signal 372. The delay created by the next edge signal 278 enables the 21.8 ns protection window created by the unlock signal 252. A rising edge in the ACK/REQ negative edge signal 208/602 can only be generated when the unlock signal 252 is high.

Figure 11:
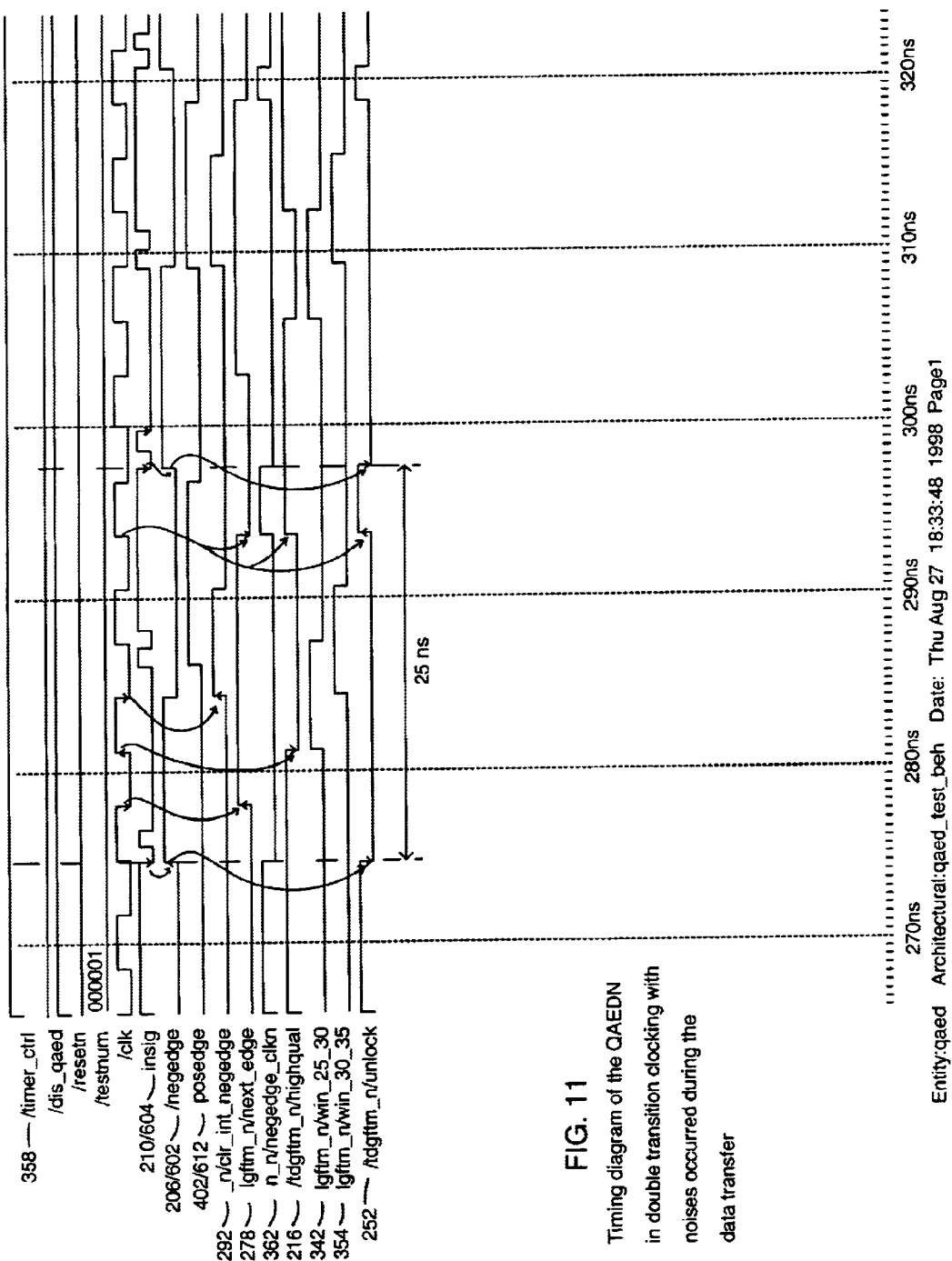
FIG. 11 is the timing diagram of the qualified asynchronous edge detector negative circuit in double transition clocking with noises occurred during the data transfer.
Figure 12:
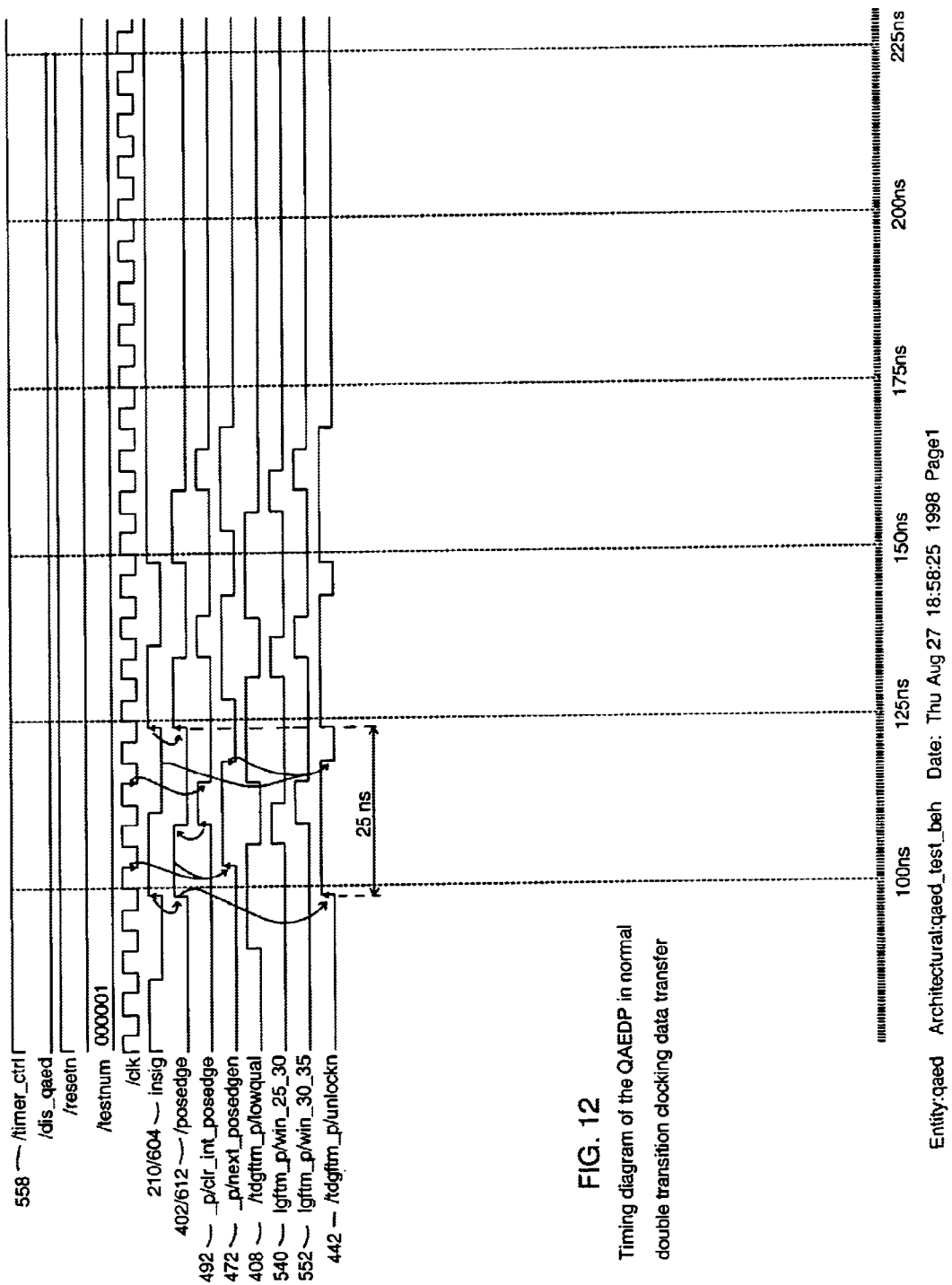
FIG. 12 is the timing diagram of the qualified asynchronous edge detector positive circuit in normal double transition clocking data transfer.
Figure 13:
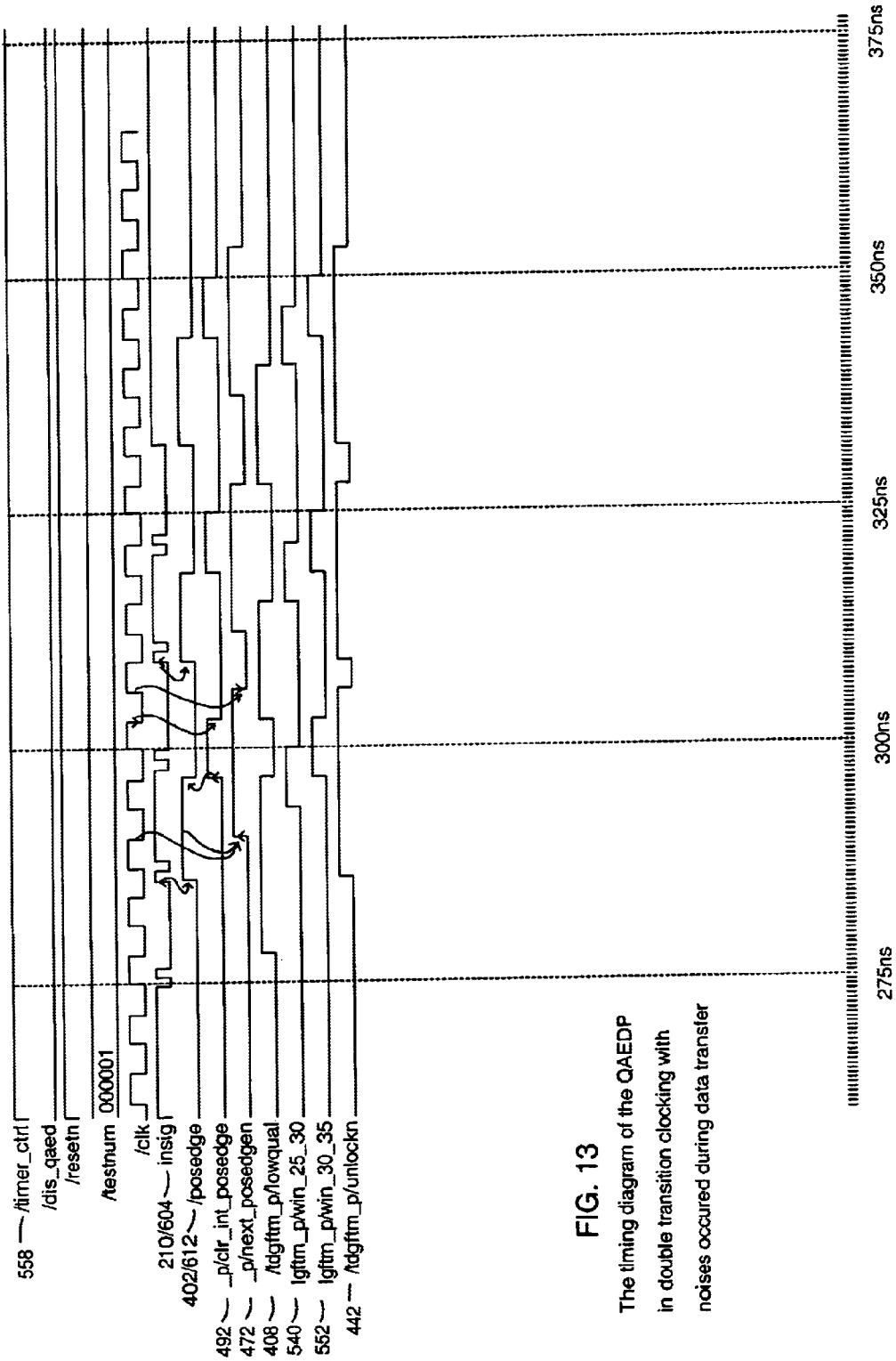
FIG. 13 is the timing diagram of the qualified asynchronous edge detector positive circuit in double transition clocking with noises occurred during the data transfer.

FIG. 11 depicts the occurrence of noise or ringing on the transmission line and in the ACK/REQ input signal 210/604. Noise in the ACK/REQ input signal 210/604 is eliminated from the ACK/REQ negative edge signal 208/602 by the signal qualification circuit 406. A rising edge in the ACK/REQ input signal 210/604 is ignored unless it has a duration greater than at least ½ of a clock cycle. Otherwise, it is reflected as noise and ignored in the rising edge qualification signal 216 with the use of the rising edge 222/230 and the falling edge 218/234 triggered flip-flops. FIGS. 12 and 13, with reference to FIG. 9, describe the functionality for generation of the ACK/REQ positive edge signal 402/612. The only differences are the unlock signal 442, the positive edge reset signal 562, and the ACK/REQ input signal 210/604 received by the signal qualification circuit 406. Details concerning the functionality of FIG. 9, in view of the timing diagrams depicted in FIGS. 12 and 13 and the description provided above will be apparent to those skilled in the art.

Operation

Figure 4:
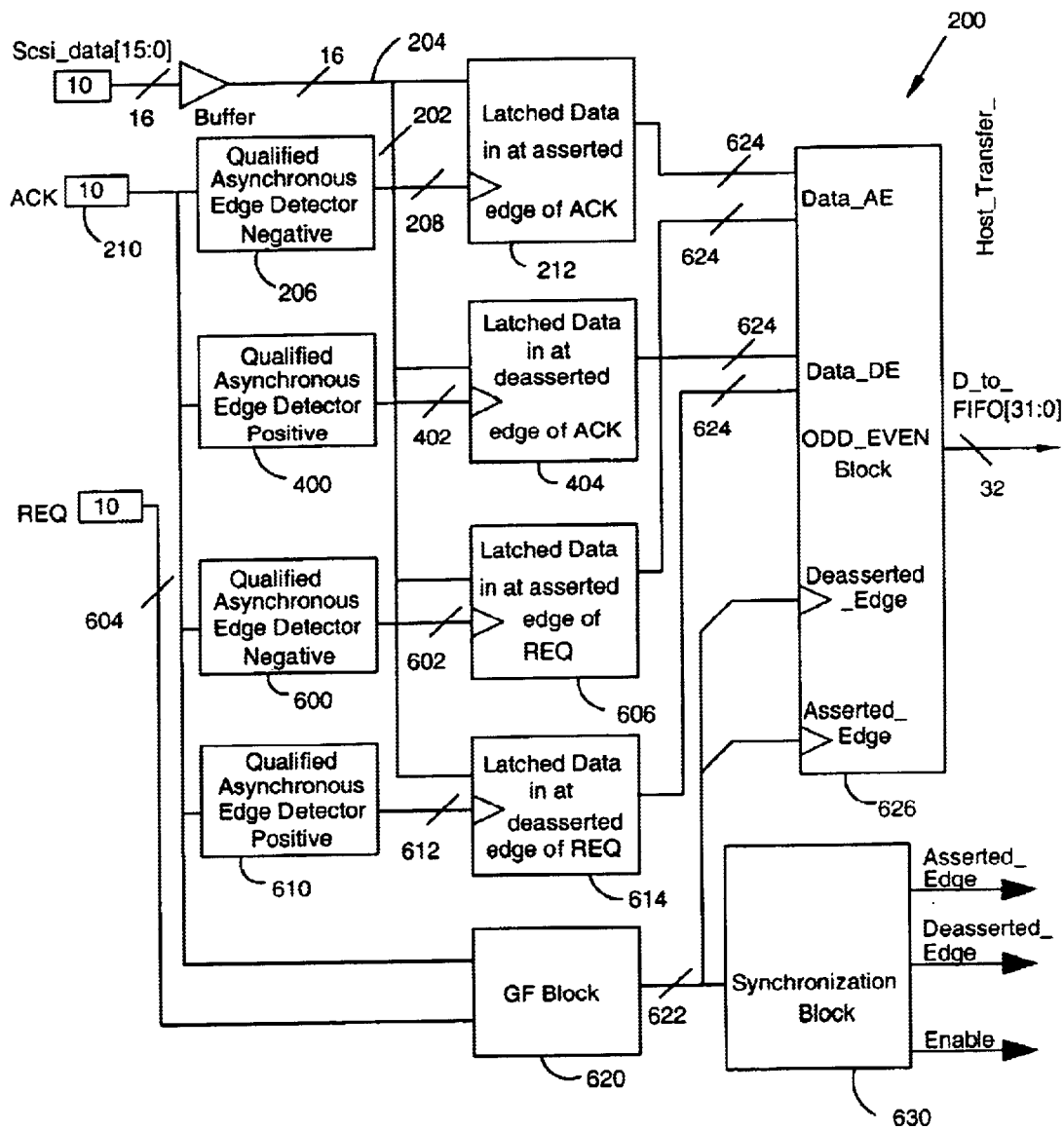
FIG. 4 depicts a data detection architecture according to a first embodiment of the invention.

FIG. 14 depicts a procedure detecting a valid signal transition in a SCSI Ultra-3 dual-transition transfer in order to latch data from an SCSI bus 204 without adding signal filtering delay for a first embodiment of the data detection apparatus 200, for example, as depicted in FIG. 4. At step 702, a signal transition of an ACK/REQ input signal 210/604 is detected. At step 704, when a falling edge of the ACK/REQ input signal 210/604 is detected, a rising edge in a negative edge signal 208/602 is generated. At step 720, when a rising edge of the input signal is detected, a rising edge in a positive edge signal 402/612 is generated. At step 740, a data cell 202 is latched from the SCSI bus 204 in response to the rising edge of the positive/negative edge signal 208/602/402/612. At step 750, a falling edge in the ACK/REQ positive/negative edge signal 208/602/402/612 is generated after a predetermined clock period of time. Finally, at step 760, steps 704 through 750 are repeated for each signal transition of the ACK/REQ input signal 210/404.

FIG. 15 depicts additional procedural method steps for generating the rising edge in the ACK/REQ negative edge signal 208/602 of step 704 of the data detection procedure, for example, in the data detection apparatus 200, as depicted in FIG. 6. At step 706, an unlock signal 252 is generated following a predetermined number of clock cycles from a last detection of the falling edge of the ACK/REQ input signal 210/604. Finally at step 708, the generation of a subsequent rising edge in the ACK/REQ negative edge signal 208/602 is delayed until the unlock signal 252 is received. The predetermined number of clock cycles of step 706 is preferably a programable period of time to accommodate faster or slower input frequencies.

FIG. 16 depicts additional procedural method steps for generating the rising edge in the ACK/REQ positive edge signal 402/612 of step 720 of the of the data detection procedure 700, for example, in the data detection apparatus 200, as depicted in FIG. 7. At step 722, a unlock signal 442 is generated following a predetermined number of clock cycles from a last detection of the rising edge of the ACK/REQ input signal 210/604. Finally, at step 724, the generation of a subsequent rising edge in the ACK/REQ positive edge signal 402/612 is delayed until the unlock signal 442 is received. The predetermined number of clock cycles of step 706 is preferably a programable period of time to accommodate faster or slower input frequencies.

Figure 17:
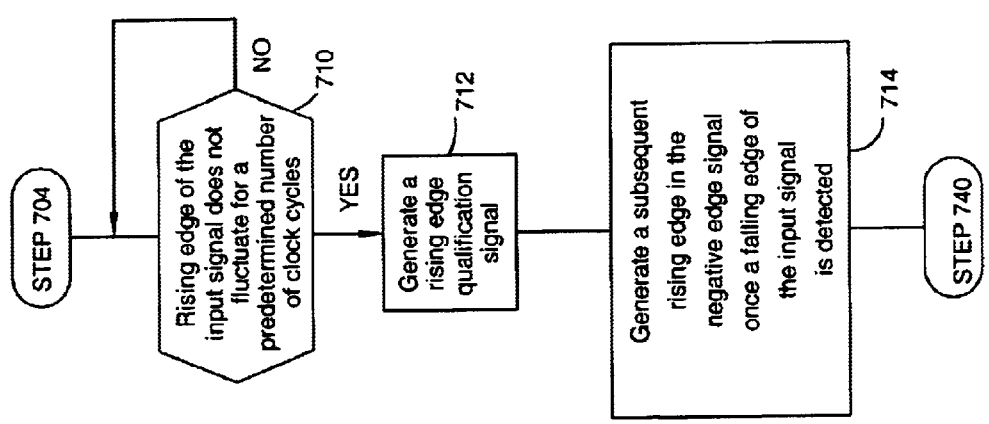
FIG. 17 is a flowchart depicting additional method steps for detecting a valid signal transition in a SCSI Ultra-3 dual-transition transfer in order to latch data from an SCSI bus according to a further embodiment of the invention.

FIG. 17 depicts additional procedural method steps for generating the rising edge in the ACK/REQ negative edge signal 208/604 of step 704 of the data detection procedure 700, for example, in the data detection apparatus 200, as depicted in FIG. 6. At step 710, detection of a valid rising edge of the input signal is verified by ensuring that the rising edge of the input signal does not fluctuate for a predetermined number of clock cycles. At step 712, when a valid rising edge of the input signal is detected, a rising edge qualification signal is generated. Finally at step 714, generation of a subsequent rising edge in the negative edge signal is delayed until the rising edge qualification signal is received, thereby eliminating noise from the ACK/REQ negative edge signal 208/602.

Figure 18:
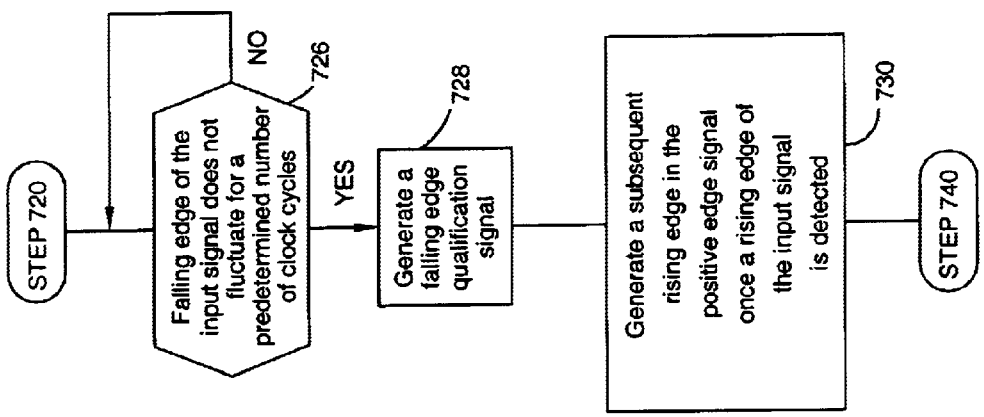
FIG. 18 is a flowchart depicting additional method steps for detecting a valid signal transition in a SCSI Ultra-3 dual-transition transfer in order to latch data from an SCSI bus according to a further embodiment of the invention.

FIG. 18 depicts additional procedural method steps for generating the rising edge in the ACK/REQ positive edge signal 402/612 of step 720 of the data detection procedure 700, for example, in the data detection apparatus 200, as depicted in FIG. 7. At step 726, detection of a valid falling edge of the ACK/REQ input signal 210/604 is verified by ensuring that the falling edge of the ACK/REQ input signal 210/604 does not fluctuate for a predetermined number of clock cycles. At step 728, when a valid falling edge of the input signal is detected, a falling edge qualification signal is generated. Finally at step 730, generation of a subsequent rising edge in the negative edge signal is delayed until the falling edge qualification signal is received, thereby eliminating noise from the ACK/REQ positive edge signal 402/612.

A data detection apparatus 200 for detecting data cells on an SCSI bus using double transition clocking includes a first qualified asynchronous edge detector negative 206 configured to generate a rising edge signal transition of an ACK negative edge signal 208 in response to each valid falling edge detected from an ACK input signal 210. A first asserted edge memory unit 212 configured to latch a data cell 202 from the SCSI bus 204 in response to each rising edge of the ACK negative edge signal 208. A first qualified asynchronous edge detector positive 400 configured to generate a rising edge signal transition of an ACK positive edge signal 402 in response to each valid rising edge detected from the ACK input signal 210. A first de-asserted edge memory unit 404 configured to latch a data cell 202 from the SCSI bus 204 in response to each rising edge of the ACK positive edge signal 402. A second qualified asynchronous edge detector negative 600 configured to generate a rising edge signal transition of an REQ negative edge signal 602 in response to each valid falling edge detected from a REQ input signal 604. A second asserted edge memory unit 606 configured to latch a data cell 202 from the SCSI bus 204 in response to each rising edge of the REQ negative edge signal 602. A second qualified asynchronous edge detector positive 610 configured to generate a rising edge signal transition of an REQ positive edge signal 612 in response to each rising valid edge detected from the REQ input signal 604. A second de-asserted edge memory unit 614 configured to latch a data cell 202 from the SCSI bus 204 in response to each rising edge of the REQ positive edge signal 612. A filter block 620 configured to delay the generation of a strobe signal 622 to transfer data 624 from the first and second asserted edge 212/606 and the first and second de-asserted edge 404/614 memory units to an odd even block intermediate storage device 626. A synchronization block 630 configured to transfer the data 624 from the intermediate storage device 626 to a host (not shown).

Exemplary embodiments have been described with reference to specific configurations. Those skilled in the art will appreciate that various changes and modifications can be made while remaining within the scope of the claims. It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular data latches or edge trigger flip flops may vary depending on the particular application for the qualified asynchronous edge detection while maintaining substantially the same functionality without departing from the scope and spirit of the present invention. In addition, although the preferred embodiment described herein is directed data detection form an SCSI Ultra-3 bus, it will be appreciated by those skilled in the art that the teachings of the present invention can be applied to other data detection systems without departing from the scope and spirit of the present invention. For example, for detecting data from any double transition clocking data transfer. In addition, various configuration of data latches to create a desires signal protection window are possible while still remaining within the scope of the claims.

The invention provides many advantages over known techniques. Advantages of the invention include a data detection apparatus and method that does not add signal delay from an input ACK/REQ signal to a filtered output signal. In addition, only the first edge of the asynchronous ACK/REQ input signal is taken for the filtered output signal. Data is therefor latched from the bus at the first edge of an ACK/REQ input signal, thereby eliminating all transmission noise that causes a shoulder or ringing noise on the transmission line. The present invention also eliminates all noise inside a protection time window after the first edge. The protection time window of the present invention can be programmable for a faster or slower input frequency. Also, the circuitry is process independent, since no delay lines or cells are used. The present invention also utilizes a high frequency clock such that it provides small granularity for extending the protection window from the valid edge to its maximum before the next valid edge. For example, the period of time between two valid falling edges, or two valid rising edges of ACK/REQ input signal in the double transition clocking mode in SCSI-3 is 25 ns. In QAEDN and QAEDP designs a 160 Mhz clock is used, and therefore, the protection window can be extended to a maximum of 21.8 ns.

Having disclosed exemplary embodiments and the best mode, modifications and variations may be made to the disclosed embodiments while remaining within the scope of the invention as defined by the following claims.

What is claimed is:

1. A method for detecting a valid signal transition in a SCSI Ultra-3 dual-transition transfer in order to latch data from a SCSI bus without adding signal filtering delay, comprising steps of:

detecting a signal transition of an input signal;

when a falling edge of the input signal is detected, generating a rising edge in a negative edge signal;

when a rising edge of the input signal is detected, generating a rising edge in a positive edge signal;

latching a data cell from the SCSI bus in response to the rising edge of the positive/negative edge signal;

generating a falling edge in the positive/negative edge signal after a predetermined period of time; and repeating the aforementioned steps for each signal transition of the input signal.

2. The method of claim 1, wherein the step of generating the rising edge in the negative edge signal further includes steps of:

generating an unlock signal following a predetermined number of clock cycles from a last detection of the falling edge of the input signal; and delaying the generation of a subsequent rising edge in the negative edge signal until the unlock signal is detected.

3. The method of claim 2, wherein the step of generating the unlock signal further includes a step of:

using a period of time as the predetermined number of clock cycles.

4. The method of claim 1, wherein the step of generating the rising edge in the positive edge signal further includes steps of:

generating an unlock signal following a predetermined number of clock cycles from a last detection of the rising edge of the input signal; and delaying the generation of a subsequent rising edge in the positive edge signal until the unlock signal is detected.

5. The method of claim 4, wherein the step of generating the unlock signal further includes a step of:

using a period of time as the predetermined number of clock cycles.

6. The method of claim 1, wherein the step of generating the rising edge in the negative edge signal further includes steps of:

verifying that a valid rising edge of the input signal is detected by ensuring that the rising edge of the input signal does not fall for a predetermined number of clock cycles, when a valid rising edge of the input signal is detected, generating a rising edge qualification signal; and delaying the generation of a subsequent rising edge in the negative edge signal until the rising edge qualification signal is detected, thereby eliminating noise from the negative edge signal.

7. The method of claim 1, wherein the step of generating the rising edge in the positive edge signal further includes steps of:

verifying that a valid falling edge of the input signal is detected by ensuring that the falling edge of the input signal does not fall for a predetermined number of clock cycles, when a valid falling edge of the input signal is detected, generating a falling edge qualification signal; and delaying the generation of a subsequent falling edge in the negative edge signal until the falling edge qualification signal is detected, thereby eliminating noise from the positive edge signal.

8. A data detection apparatus for detecting data cells on a SCSI bus using double transition clocking, comprising:

a first qualified asynchronous edge detector negative configured to generate a rising edge signal transition of an ACK negative edge signal in response to each falling edge detected from an ACK input signal;

a first asserted edge memory unit configured to latch a data cell from the SCSI bus in response to each rising edge of the ACK negative edge signal;

a first qualified asynchronous edge detector positive configured to generate a rising edge signal transition of an ACK positive edge signal in response to each rising edge detected from the ACK input signal;

a first de-asserted edge memory unit configured to latch a data cell from the SCSI bus in response to each rising edge of the ACK positive edge signal;

a second qualified asynchronous edge detector negative configured to generate a rising edge signal transition of a REQ negative edge signal in response to each falling edge detected from a REQ input signal;

a second asserted edge memory unit configured to latch a data cell from the SCSI bus in response to each rising edge of the REQ negative edge signal;

a second qualified asynchronous edge detector positive configured to generate a rising edge signal transition of a REQ positive edge signal in response to each rising edge detected from the REQ input signal;

a second de-asserted edge memory unit configured to latch a data cell from the SCSI bus in response to each rising edge of the REQ positive edge signal;

a filter block configured to delay the generation of a strobe signal to transfer data from the first and second asserted edge and the first and second de-asserted edge memory units to an intermediate storage device; and a synchronization block configured to transfer the data from the intermediate storage device.

9. The data detection apparatus of claim 8, further comprising:

an input control gate coupled to the filter block, the input control gate having a first state wherein the ACK input signal is transferred to the filter block and a second state wherein the REQ input signal is transferred to the filter block;

a general purpose data register configured to store host write data;

a data memory unit configured to latch control data from a sequencer bus;

an asserted data control gate coupled to the intermediate storage device, the asserted data control gate having a first state wherein the host write data is transferred to the intermediate storage device, a second state wherein the control data is transferred to the intermediate storage device, a third state wherein the data cell within the first asserted edge memory unit is transferred to the intermediate storage device and a fourth state wherein the data cell within the second asserted edge memory unit is transferred to the intermediate storage device; and a de-asserted data control gate coupled to the intermediate storage device, the de-asserted data control gate having a first state wherein the data cell within the first de-asserted edge memory unit is transferred to the intermediate storage device and a second state wherein the data cell within the second de-asserted edge memory unit is transferred to the intermediate storage device.

10. The apparatus of claim 8, wherein the first and second qualified asynchronous edge detector negative comprise:

a signal qualification circuit configured to generate a rising edge qualification signal by verifying that a valid rising edge of the ACK/REQ input signal is detected by ensuring that the rising edge of the ACK/REQ input signal does not fall for a predetermined number of clock cycles, thereby eliminating noise from the ACK/REQ negative edge signal;

a signal transition circuit configured to generate an unlock signal following a predetermined number of clock cycles from a last detection of the falling edge of the ACK/REQ input signal;

a signal reset circuit configured to generate a negative reset signal for the ACK/REQ negative edge signal after a predetermined period of time;

an AND gate configured to generate a negative edge clock signal from a logical AND operation of the ACK/REQ input signal and the unlock signal;

a latch circuit having a complement value of the negative edge clock signal as a clock signal, the negative edge reset signal as a reset signal and the rising edge qualification signal as a data input signal, the latch circuit configured to generate an internal negative edge signal as a data output; and an output control gate having a first state wherein the ACK/REQ signal is transferred as an output of the output control gate and a second state wherein internal negative edge signal is transferred as the output of the output control gate to generate the ACK/REQ negative edge signal.

11. The apparatus of claim 8, wherein the first and second qualified asynchronous edge detector positive comprise:

a signal qualification circuit configured to generate a falling edge qualification signal by verifying that a valid falling edge of the ACK/REQ input signal is detected by ensuring that the falling edge of the ACK/REQ input signal does not rise for a predetermined number of clock cycles, thereby eliminating noise from the ACK/REQ positive edge signal;

a signal transition circuit configured to generate an unlock signal following a predetermined number of clock cycles from a last detection of the rising edge of the a signal reset circuit configured to generate a positive edge reset signal for the ACK/REQ positive edge signal after a predetermined period of time;

an OR gate configured to generate a positive edge clock signal from a logical OR operation of the ACK/REQ input signal and the unlock signal;

a latch circuit having the positive edge clock signal as a clock signal, the positive edge reset signal as a reset signal and the falling edge qualification signal as a data input, the latch circuit configured to generate an internal positive edge signal as a data output; and an output control gate having a first state wherein the ACK/REQ signal is transferred as an output of the output control gate and a second state wherein internal positive edge signal is transferred as the output of the output control gate to generate the ACK/REQ positive edge signal.

12. The apparatus of claim 10, wherein the signal qualification circuit comprises:
   a first negative edge trigger flip-flop having the ACK/REQ input signal as a data input;
   a first positive edge trigger flip-flop having an output of the first negative edge trigger flip-flop as a data input to generate a first data output;
   a second positive edge trigger flip-flop having the ACK/REQ input signal as a data input;
   a second negative edge trigger flip-flop having an output of the second positive edge trigger flip-flop as a data input to generate a second data output; and
   an OR gate configured to perform a logical OR operation from the first data output and the second data output to generate the rising edge qualification signal.

13. The apparatus of claim 10, wherein the signal transition circuit comprises:
   a first negative edge trigger flip-flop having the internal negative edge signal as a data input;
   a first positive edge trigger flip-flop having an output of the first negative edge trigger flip-flop as a data input to generate a first data output;
   a second positive edge trigger flip-flop having the internal negative edge signal as a data input;
   a second negative edge trigger flip-flop having an-output of the second positive edge trigger flip-flop as a data input to generate a second data output;
   an OR gate configured to perform a logical OR operation from the first data output and the second data output to generate a next negative edge signal; and
   an AND gate configured to perform a logical AND operation from a complement
      value of the internal negative edge signal and a complement
         value of the next negative edge signal to generate the unlock signal.

14. The apparatus of claim 13, wherein the signal reset circuit comprises:
   a first negative data flip-flop having the first data output of the first positive edge trigger flip-flop as a data input to generate a first negative data output;
   a second negative data flip-flop having the first negative data output as a data input to generate a second negative data output;
   a third negative data flip-flop having the second negative data output as a data input to generate a third negative data output;
   a first positive data flip-flop having the second data output of the second negative edge trigger flip-flop as a data input to generate a first positive data output;
   a second positive data flip-flop having the first positive data output as a data input to generate a second positive data output;
   a third positive data flip-flop having the second positive data output as a data input to generate a third positive data output;
   a first AND gate configured to perform a logical AND operation from the first positive data output and a complement value of the second positive data output to generate a first gate output;
   a second AND gate configured to perform a logical AND operation from the first negative data output and a complement value of the second negative data output to generate a second gate output;
   a first OR gate configured to perform a logical OR operation from a flip-flop reset signal, the first gate output and the second gate output to generate a first window signal;
   a third AND gate configured to perform a logical AND operation from the second positive data output and a complement value of the third positive data output to generate a third gate output;
   a fourth AND gate configured to perform a logical AND operation from the second negative data output and a complement value of the third negative data output to generate a fourth gate output;
   a second OR gate configured to perform a logical OR operation from the reset signal, the third gate output and the fourth gate output to generate a second window signal; and
   a control gate having a first state wherein the first window signal is transferred as a control gate output and a second state wherein the second window signal is transferred as the control gate output to generate the negative edge reset signal.

15. The apparatus of claim 11, wherein the signal qualification circuit comprises:
   a first negative edge trigger flip-flop having a complement value of the ACK/REQ input signal as a data input;
   a first positive edge trigger flip-flop having an output of the first negative edge trigger flip-flop as a data input to generate a first data output;
   a second positive edge trigger flip-flop having a complement value of the ACK/REQ input signal as a data input;
   a second negative edge trigger flip-flop having an output of the second positive edge trigger flip-flop as a data input to generate a second data output; and
   an OR gate configured to generate a logical OR operation from the first data output and the second data output to generate the falling edge qualification signal.

16. The apparatus of claim 11, wherein the signal transition circuit comprises:
   a first negative edge trigger flip-flop having the internal positive edge signal as a data input;
   a first positive edge trigger flip-flop having an output of the first negative edge trigger flip-flop as a data input to generate a first data output;
   a second positive edge trigger flip-flop having the internal negative edge signal as a data input;
   a second negative edge trigger flip-flop having ant output of the second positive edge trigger flip-flop as a data input to generate a second data output;
   a next edge OR gate configured to generate a logical OR operation from the first data output and the second data output to generate a next positive edge signal; and
   an unlock OR gate configured to generate a logical OR operation from the internal positive edge signal and the next positive edge signal to generate the unlock signal.

17. The apparatus of claim 16, wherein the signal reset circuit comprises:
   a first negative data flip-flop having the first data output of the first positive edge trigger flip-flop as a data input to generate a first negative data output;
   a second negative data flip-flop having the first negative data output as a data input to generate a second negative data output;

a third negative data flip-flop having the second negative data output as a data input to generate a third negative data output;

a first positive data flip-flop having the second data output of the second positive edge trigger flip-flop as a data input to generate a first positive data output;

a second positive data flip-flop having the first positive data output as a data input to generate a second positive data output;

a third positive data flip-flop having the second positive data output as a data input to generate a third positive data output;

a first AND gate configured to perform a logical AND operation from the first positive data output and a complement value of the second positive data output to generate a first gate output;

a second AND gate configured to perform a logical AND operation from the first negative data output and a complement value of the second negative data output to generate a second gate output;

a first OR gate configured to perform a logical OR operation from a flip-flop reset signal, the first gate output and the second gate output to generate a first window signal;

a third AND gate configured to perform a logical AND operation from the second positive data output and a complement value of the third positive data output to generate a third gate output;

a fourth AND gate configured to perform a logical AND operation from the second negative data output and a complement value of the third negative data output to generate a fourth gate output;

a second OR gate configured to perform, a logical OR operation from the reset signal, the third gate output and the fourth gate output to generate a second window signal; and a control gate having a first state wherein the first window signal is transferred as a control gate output and a second state wherein the second window signal is transferred as the control gate output to generate the positive edge reset signal.

18. A data detection apparatus for detecting data cells on a SCSI bus using double transition clocking, comprising:

means for generating a rising edge signal transition of an ACK/REQ negative edge signal in response to each falling edge detected from an ACK/REQ input signal;

means for latching a falling edge data cell from the SCSI bus in response to each rising edge of the ACK negative edge signal;

means for generating a rising edge signal transition of an ACK/REQ positive edge signal in response to each rising edge detected from the ACK/ REQ input signal;

means for latching a rising edge data cell from the SCSI bus in response to each rising edge of the ACK/ REQ positive edge signal;

means for transferring the falling edge data cell and the rising edge data cell to an intermediate storage device; and means for transferring data from the intermediate storage device.

19. The apparatus according to claim 18, wherein the means for generating a rising edge signal transition of an ACK/REQ negative edge signal in response to each falling edge detected from an ACK/REQ input signal, comprises:

means for generating a rising edge qualification signal by verifying that a valid rising edge of the ACK/REQ input signal is detected by ensuring that the rising edge of the ACK/REQ input signal does not fall for a predetermined number of clock cycles;

means for generating an unlock signal following a predetermined number of clock cycles from a last detection of the falling edge of the ACK/REQ input signal;

means for generating a negative edge reset signal for the ACK/REQ negative edge signal after a predetermined period of time;

means for generating a negative edge clock signal from a logical AND operation of the ACK/REQ input signal and the unlock signal;

a latch circuit having a complement value of the negative edge clock signal as a clock signal, the negative edge reset signal as a reset signal and the rising edge qualification signal as a data input signal, the latch circuit having means for generating an internal negative edge signal as a data output; and an output control gate having a first state wherein the ACK/REQ signal is transferred as an output of the output control gate and a second state wherein internal negative edge signal is transferred as the output of the output control gate to generate the ACK/REQ negative edge signal.

20. The apparatus according to claim 18, wherein the means for generating a rising edge signal transition of an ACK/REQ positive edge signal in response to each rising edge detected from an ACK/REQ input signal, comprises:

means for generating a falling edge qualification signal by verifying that a valid falling edge of the ACK/REQ input signal is detected by ensuring that the falling edge of the ACK/REQ input signal does not rise for a predetermined number of clock cycles;

means for generating an unlock signal following a predetermined number of clock cycles from a last detection of the rising edge of the ACK/REQ input signal;

means for generating a positive edge reset signal for the ACK/REQ positive edge signal after a predetermined period of time;

means for generating a positive edge clock signal from a logical OR operation of the ACK/REQ input signal and the unlock signal;

a latch circuit having the positive edge clock signal as a clock signal, the positive edge reset signal as a reset signal and the falling edge qualification signal as a data input, the latch circuit having means for generating an internal positive edge signal as a data output; and an output control gate having a first state wherein the ACK/REQ signal is transferred as an output of the output control gate and a second state wherein internal positive edge signal is transferred as the output of the output control gate to generate the ACK/REQ positive edge signal.

* * * * *